United States Patent
Pulipati et al.

(10) Patent No.: US 10,637,462 B1
(45) Date of Patent: Apr. 28, 2020

(54) SYSTEM AND METHOD FOR SOC POWER-UP SEQUENCING

(71) Applicant: Xilinx, Inc., San Jose, CA (US)

(72) Inventors: Narendra Kumar Pulipati, Hyderabad (IN); Sree R K C Saraswatula, Hyderabad (IN); Santosh Yachareni, Hyderabad (IN); Weiguang Lu, San Jose, CA (US); Fu-Hing Ho, Los Gatos, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 16/426,985

(22) Filed: May 30, 2019

(51) Int. Cl.
| | |
|---|---|
| H03K 17/22 | (2006.01) |
| G06F 1/24 | (2006.01) |
| H03K 19/17736 | (2020.01) |
| H03K 19/17756 | (2020.01) |
| H03K 19/17772 | (2020.01) |
| H03K 19/1776 | (2020.01) |

(52) U.S. Cl.
CPC ....... H03K 17/22 (2013.01); H03K 19/17736 (2013.01); H03K 19/17756 (2013.01); H03K 19/17772 (2013.01); H03K 19/1776 (2013.01)

(58) Field of Classification Search
CPC combination set(s) only.
See application file for complete search history.

(56) References Cited

U.S. PATENT DOCUMENTS

| | | | |
|---|---|---|---|
| 5,166,545 A | 11/1992 | Harrington | |
| 7,271,504 B2* | 9/2007 | Wada | G06F 1/26 307/85 |
| 8,612,789 B2* | 12/2013 | Taylor | H03K 19/177 713/324 |
| 8,738,860 B1 | 5/2014 | Griffin et al. | |
| 9,471,120 B1* | 10/2016 | Thakur | G06F 1/24 |
| 9,859,885 B2* | 1/2018 | Kubota | G06F 1/24 |
| 2003/0163798 A1 | 8/2003 | Hwang et al. | |
| 2014/0075218 A1 | 3/2014 | Bartling et al. | |

OTHER PUBLICATIONS

Xilinx Inc., UltraScale Architecture and Product Data Sheet: Overview, DS 890, v3.6, Product Specification, pp. 1-46, Nov. 12, 2018, San Jose, CA USA.
Xilinx Inc., Zynq-7000 SoC Technical Reference Manual, UG 585, v1.12.2, pp. 1-1846, Jul. 1, 2018, San Jose, CA USA.
Xilinx Inc., AI Engines and Their Applications, White Paper WP 506, v1.0.2, pp. 1-13, Oct. 3, 2018, San Jose, CA USA.
Xilinx Inc., AXI Interconnect v2.1, LogiCore IP Product Guide, Vivado Design Suite, PG 059, pp. 1-171, Dec. 20, 2017, San Jose, CA USA.

* cited by examiner

Primary Examiner — An T Luu
(74) Attorney, Agent, or Firm — Thompson Patent Law

(57) ABSTRACT

Apparatus and associated methods relate to a consolidated power-on-reset system (PORS) at a system-on-chip (SoC) level. In an illustrative example, an integrated circuit may include a first power domain and a second power region. A level shifter circuit may be coupled to translate data from the first power domain to the second power domain. A PORS including a voltage detection circuit, a glitch filter circuit, and logic gates may be configured to generate isolation signals between the first power domain and the second power domain. The level shifter circuit may be enabled in response to the generated isolation signals. By using the isolation signals, multiple power domains on IC may be managed comprehensively during power-up to avoid unstable operation.

20 Claims, 7 Drawing Sheets

| Pin Name | Type | Direction | Voltage Domain |
|---|---|---|---|
| iso_cframe_pl_pmc_b | digital | output | vccint_pmc |
| iso_cframe_pmc_pl_b | digital | output | vccint |
| iso_com_lpd_b | digital | output | vccint_pslp |
| iso_dfx_com_lpd_b | digital | output | vccint_pslp |
| iso_dfx_fpd_lpd_b | digital | output | vccint_pslp |
| iso_dfx_lpd_com_b | digital | output | vccint |
| iso_dfx_lpd_fpd_b | digital | output | vccint_pcfp |
| iso_dfx_lpd_pmc_b | digital | output | vccint_pmc |
| iso_dfx_pmc_lpd_b | digital | output | vccint_pslp |
| iso_fpd_lpd_b | digital | output | vccint_pslp |
| iso_fpd_pl_b | digital | output | vccint |
| iso_fpd_soc_b | digital | output | vccint_soc |
| iso_lpd_com_b | digital | output | vccint |
| iso_lpd_fpd_b | digital | output | vccint_pcfp |
| iso_lpd_pl_b | digital | output | vccint |
| iso_lpd_pmc_b | digital | output | vccint_pmc |
| iso_lpd_soc_b | digital | output | vccint_soc |
| iso_npi_pmc_soc_b | digital | output | vccint_soc |
| iso_npi_soc_pmc_b | digital | output | vccint_pmc |
| iso_pl_fpd_b | digital | output | vccint_pcfp |
| iso_pl_lpd_b | digital | output | vccint_pslp |
| iso_pl_pmc_b | digital | output | vccint_pmc |
| iso_pl_soc_b | digital | output | vccint_soc |
| iso_pmc_lpd_b | digital | output | vccint_pslp |
| iso_pmc_pl_b | digital | output | vccint |
| iso_pmc_soc_b | digital | output | vccint_soc |
| iso_soc_fpd_b | digital | output | vccint_pcfp |
| iso_soc_lpd_b | digital | output | vccint_pslp |
| iso_soc_pl_b | digital | output | vccint |
| iso_soc_pmc_b | digital | output | vccint_pmc |
| iso_test_fpd_pl_b | digital | output | vccint |
| iso_test_lpd_pl_b | digital | output | vccint |
| iso_test_pl_fpd_b | digital | output | vccint_pcfp |
| iso_test_pl_lpd_b | digital | output | vccint_pslp |
| iso_test_pl_pmc_b | digital | output | vccint_pmc |
| iso_test_pmc_pl_b | digital | output | vccint |
| iso_vccint_soc_vccaux_b | digital | output | vccaux |
| iso_vccaux_vccint_soc_b | digital | output | vccint_soc |
| iso_vccint_soc_vccram_b | digital | output | vccint_ram |
| iso_vccram_vccint_soc_b | digital | output | vccint_soc |
| iso_vccram_vccaux_b | digital | output | vccaux |
| iso_vccaux_vccram_b | digital | output | vccint_ram |
| iso_vccint_vccram_b | digital | output | vccint_ram |
| Pin Name | Type | Direction | Voltage Domain |
| iso_1_me_soc | digital | output | vccint_soc |
| iso_1_pl_me | digital | output | vccint_me |
| iso_1_me_pl | digital | output | vccint |
| iso_1_soc_me | digital | output | vccint_me |
| iso_2_me_pl | digital | output | vccint |
| iso_2_pl_me | digital | output | vccint_me |
| iso_2_me_soc | digital | output | vccint_soc |
| iso_2_soc_me | digital | output | vccint_me |

FIG. 5

SYSTEM AND METHOD FOR SOC POWER-UP SEQUENCING

TECHNICAL FIELD

Various embodiments relate generally to integrated circuit devices and, more particularly, to devices that include power management circuits that can manage multiple power supplied to System-on-Chip (SoC) during power-up.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs).

Circuit designs may be physically implemented within the programmable circuitry of a programmable IC by loading configuration data, sometimes referred to as a configuration bitstream, into the device. The configuration data may be loaded into internal configuration memory cells of the device. The collective states of the individual configuration memory cells determine the functionality of the programmable IC. For example, the particular operations performed by the various programmable circuit blocks and the connectivity between the programmable circuit blocks of the programmable IC are defined by the collective states of the configuration memory cells once loaded with the configuration data.

SUMMARY

Apparatus and associated methods relate to a consolidated power-on-reset system (PORS) at a system-on-chip (SoC) level. In an illustrative example, an integrated circuit may include a first power domain and a second power region. A level shifter circuit may be coupled to translate data from the first power domain to the second power domain. A PORS including a voltage detection circuit, a glitch filter circuit, and logic gates may be configured to generate isolation signals between the first power domain and the second power domain. The level shifter circuit may be enabled in response to the generated isolation signals. By using the isolation signals, multiple power domains on IC may be managed comprehensively during power-up to avoid unstable operation.

Various embodiments may achieve one or more advantages. For example, during power-up, power supplies having different ramp rates may be controlled, which may substantially reduce or eliminate contention current on the chip, and/or noise coupling among different power domains. In some embodiments, damage of chip during power-up that caused by multiple voltage cross domain shortages and huge current surge may be substantially reduced or eliminated. In some embodiments, the isolation signals may reach high-availability seamless redundancy protocol (HSR) before programmable logic (PL) gets power-on-reset (POR) signal. When unintentional POR/reset event happens, IO glitches may be prevented by delaying the POR signals with respect to isolation signals. In embodiments, the isolation signal between PL and network-on-chip (NoC) block supplies may be delayed (e.g., by 100 ns) due to PL power-down, which may substantially reduce the noise coupling to the NoC block. Some embodiments may provide power aware support for POR voltage detector models for register-transfer level (RTL) verification enhancement. Some embodiments may reduce the total power-up time, and some may improve the performance of the PL fabric with an on-chip voltage generation. Some embodiments may also provide a PMC deep sleep mode which may reduce power consumption at the system level. In some embodiments, a firmware (FM) dependent skip_por_cnt that can skip the 26 ms counter after knowing that all the PL supplies ($V_{ccint}$, $V_{ccint\_ram}$, $V_{ccaux}$) are up from system monitoring (SYSMON)/analog mixer signal (AMS) during normal mode may be used to generate por_pl_b signal to minimize the total power-up time. Some embodiments may provide a smooth boundary scan chain crossing multiple power domains.

In one exemplary aspect, an integrated circuit (IC) includes a first region supplied by a first power domain, a second region supplied by a second power domain. A first level shifting circuit is coupled to translate a first data from the first power domain to the second power domain and a second level shifting circuit is coupled to translate a second data from the second power domain to the first power domain. The IC also includes a power-on-reset system (PORS). The PORS includes a voltage detection circuit configured to detect voltages of the first power domain and the second power domain. A control circuit is coupled to the first level shifting circuit and the second level shifting circuit and configured to generate a first isolation signal to control the first level shifting circuit and a second isolation signal to control the second level shifting circuit in response to the detected voltages of the first power domain and the second power domain.

In some embodiments, the PORS may also include a glitch filter circuit coupled to the voltage detection circuit to indicate a voltage change of the second power domain. When the voltage change of the second power domain exceeds a predetermined time period, the control circuit may be configured to disable the second level shifting circuit a first predetermined delay after disabling the first level shifting circuit. In some embodiments, the control circuit may be further configured to release a power-on-reset signal to reset the second power domain a second predetermined delay after disabling the second level shifting circuit.

In some embodiments, the control circuit may be configured to release a power-on-reset signal to reset the second power domain a second predetermined delay after disabling the second level shifting circuit. The second region may be disposed in a portion of the IC that is non-overlapping with the first region. The first region may include a platform management controller (PMC) configured to work as a master power supply and provide power management of the IC. The second region may include a block of programmable logic (PL). The second region may include a processor system (PS). In some embodiments, the integrated circuit may also include a third region supplied by a third power domain. A third level shifting circuit may be coupled to translate a third data from the second power domain to the third power domain and a fourth level shifting circuit may be coupled to translate a fourth data from the third power domain to the second power domain. The voltage detection circuit may be further configured to detect voltages of the first power domain, the second power domain and the third power domain. The control circuit may be further coupled to the third level shifting circuit and the fourth level shifting circuit and configured to generate a third isolation signal to control the third level shifting circuit and a fourth isolation signal to control the fourth level shifting circuit in response to the detected voltages of the first power domain, the second power domain, and the third power domain. In some embodiments, the third region may include a data processing engine (DPE) array.

In another exemplary aspect, a method includes supplying a first region by a first power domain and supplying a second region by a second power domain. A first level shifting circuit is coupled to transfer a first data from the first power domain to the second power domain, and a second level shifting circuit is coupled to transfer a second data from the second power domain to the first power domain. The method also includes detecting voltages of the first power domain and the second power domain and generating a first isolation signal to control the first level shifting circuit and a second isolation signal to control the second level shifting circuit in response to the detected voltages of the first power domain and the second power domain.

In some embodiments, when a voltage change of the second power domain exceeds a predetermined time period, the method may include using the first isolation signal to disable the first level shifting circuit, using the second isolation signal to disable the second level shifting circuit a first predetermined delay after disabling the first level shifting circuit, and, releasing a power-on-reset signal to reset the second power domain a second predetermined delay after disabling the second level shifting circuit.

In some embodiments, the second region may be disposed in a portion of the IC that is non-overlapping with the first region. The first region may include a platform management controller (PMC) configured to work as a master power supply and provide power management of the IC. In some embodiments, the second region may include a processor system. In some embodiments, the second region may include an extended performance I/O block (XPIO). The second region may include a block of programmable logic (PL).

In some embodiments, the method may also include (1) supplying a third region by a third power domain, a third level shifting circuit is coupled to transfer a third data from the second power domain to the third power domain, and a fourth level shifting circuit is coupled to transfer a fourth data from the third power domain to the second power domain, (2) detecting voltages of the first power domain, the second power domain, and the third power domain, and, (3) generating a third isolation signal to control the third level shifting circuit and a fourth isolation signal to control the fourth level shifting circuit in response to the detected voltages of the first power domain, the second power domain, and the third power domain.

In some embodiments, when a voltage change of the third power domain exceeds a predetermined time period, the method may also include (4) using the third isolation signal to disable the third level shifting circuit, (5) using the fourth isolation signal to disable the fourth level shifting circuit a third predetermined delay after disabling the third level shifting circuit, and, (6) releasing a power-on-reset signal to reset the third power domain a fourth predetermined delay after disabling the fourth level shifting circuit. In some embodiments, the third region may include a data processing engine (DPE) array.

The details of various embodiments are set forth in the accompanying drawings and the description below. Other features and advantages will be apparent from the description and drawings, and from the claims.

BRIEF DESCRIPTION OF THE DRAWINGS

FIG. 5 depicts a data sheet relating to exemplary isolation signals generated by the PORS.

Like reference symbols in the various drawings indicate like elements.

DETAILED DESCRIPTION OF ILLUSTRATIVE EMBODIMENTS

To aid understanding, this document is organized as follows. First, an exemplary platform (e.g., FPGA) suitable to comprehensively manage signal isolation across power domains during power on transient conditions is briefly introduced with reference to FIG. 1. Second, with reference to FIGS. 2-4, the discussion turns to introduce how exemplary power-on-reset system (PORS) may be used to generate isolation signals between different power domains. Then, with reference to FIG. 5, the discussion discloses exemplary isolation signals generated by the power-on-reset system (PORS). Finally, with reference to FIG. 6, the discussion discloses exemplary method to coordinate power transitions among power domains in IC. By using the power-on-reset system (PORS), multiple power supplies of a system-on-chip (SoC) during power-up may be managed so that contention current on the chip may be substantially reduced or eliminated.

Figure 1:
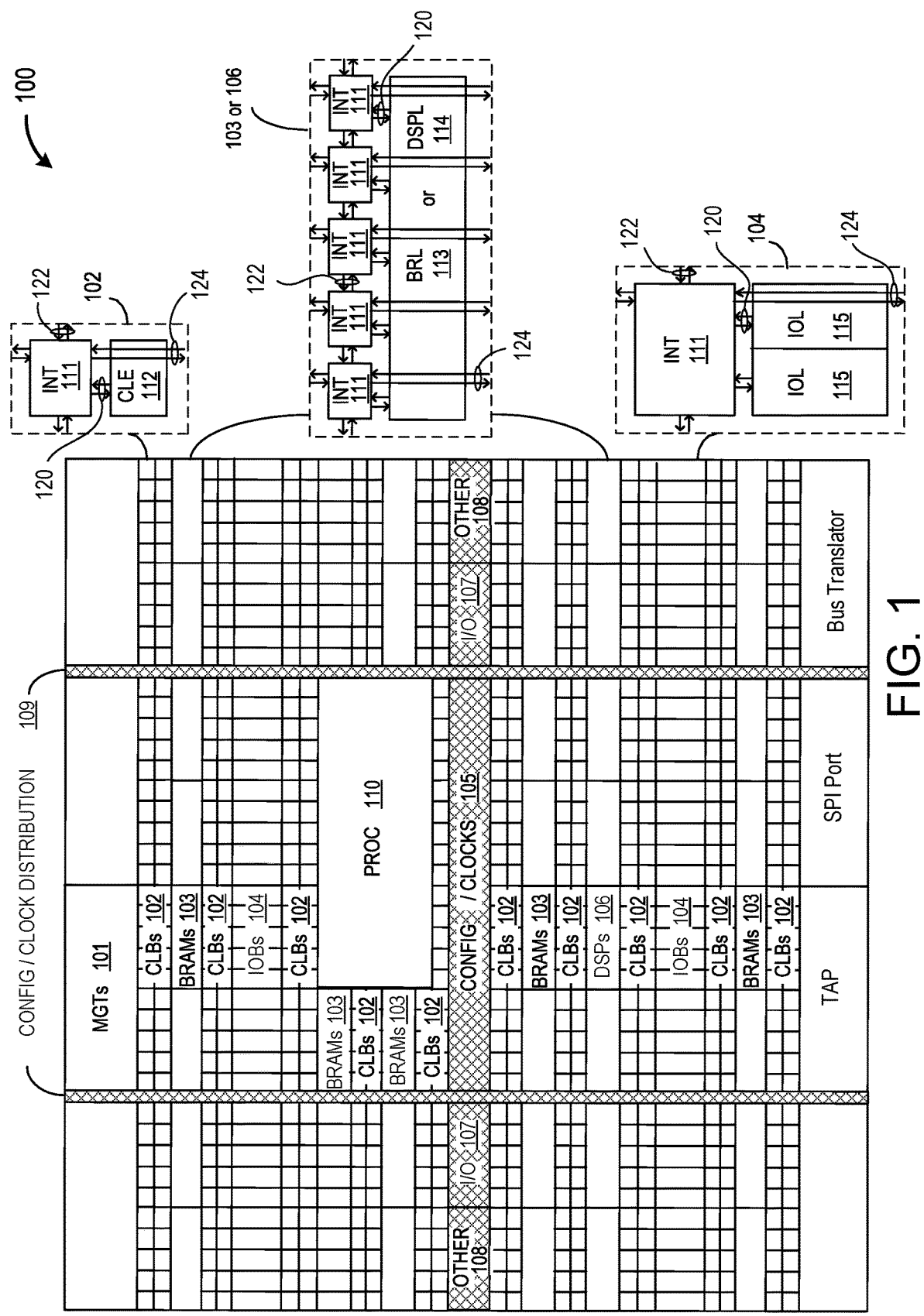
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System-on-Chip (SoC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Programmable logic (PL) and processor system (PS) may be integrated in a single chip to have comprehensive functions. The single chip may be implemented in communication systems, medical devices, and, areas of vision, for example. The single chip may have multiple power domains. Different ramp rates of any/all power supplies may lead to coupling noises and contention current, for example. A power-on-reset system (PORS) may be used during power-up to manage signal transmissions among different power domains that are operatively supplied by multiple power supplies of the single chip.

Figure 2:
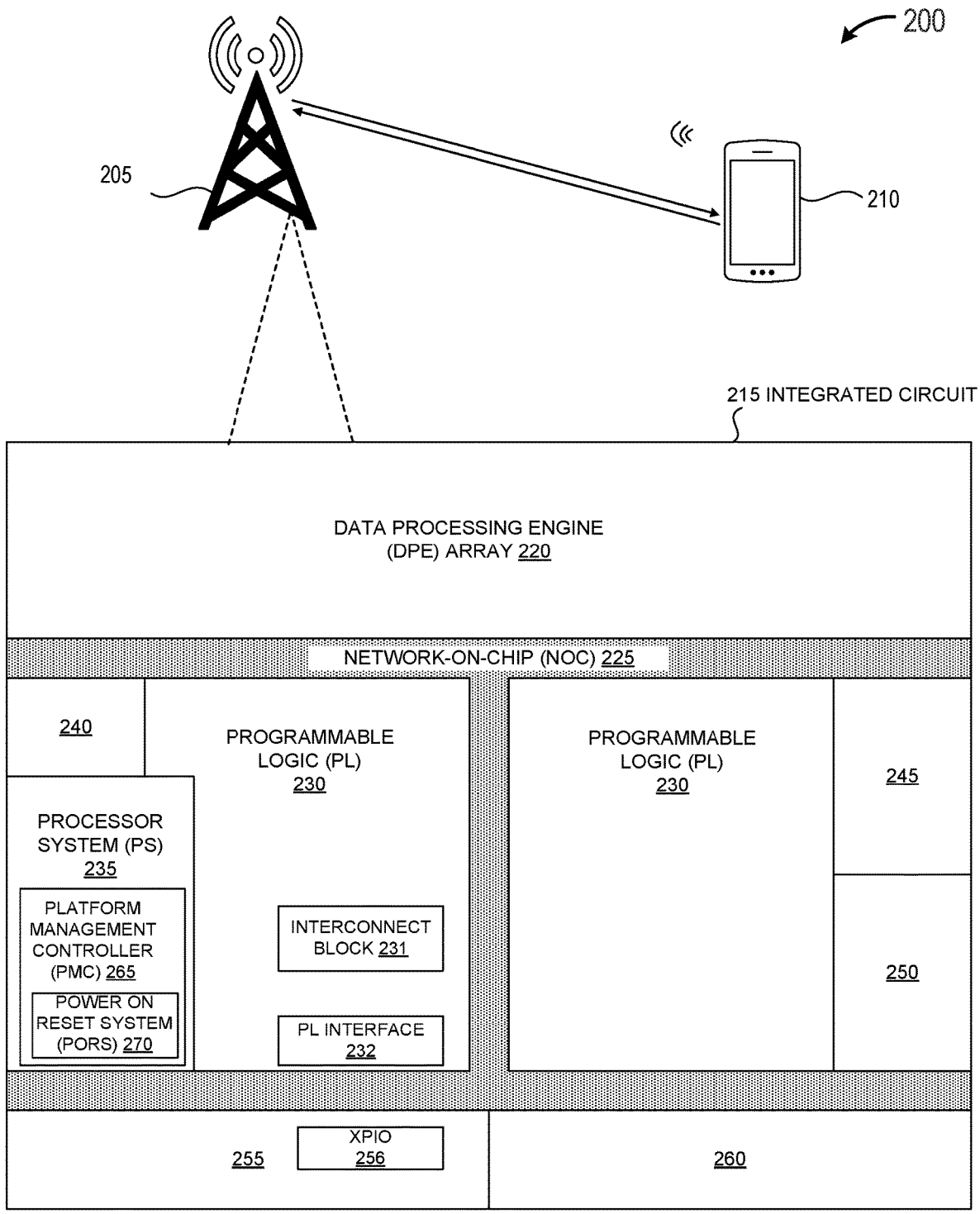
FIG. 2 depicts an exemplary integrated circuit having a power-on-reset system (PORS) at a system-on-chip (SoC) level.

FIG. 2 depicts an exemplary integrated circuit having a power-on-reset system (PORS) at a system-on-chip (SoC) level. In this depicted example, a communication system 200 includes a base station 205. The base station 205 may be used to transmit and receive analog signals from a cell phone 210. The base station 205 includes an integrated circuit (IC) 215 to perform data communication between the base station 205 and the cell phone 210. IC 215 may also be used to perform data processing using separate circuits that are separately supplied by multiple power domains. In various embodiments, multiple power domains may be supplied by separate, independent voltage regulators, for example. Various embodiments may be separate domains that are supplied by a common regulator through independent electrical paths, and which may have separate inductive or capacitive filtering, for example.

In this depicted example, IC 215 is implemented as a System-on-Chip (SoC) type of device. In general, an SoC refers to an IC that includes two or more subsystems capable of interacting with one another. As an example, an SoC may include a processor that executes program code and one or more other circuits. The other circuits may be implemented as hardwired circuitry, programmable circuitry, other subsystems, and/or any combination thereof. The circuits may operate cooperatively with one another and/or with the processor. In this depicted example, an SoC includes a data processing engine (DPE) array 220. The DPE array 220 may include one or more DPEs. The DPE may include a math engine (ME), for example.

For purpose of illustration, IC 215 includes a programmable logic (PL) 230. The PL 230 is circuitry that may be programmed to perform specified functions. As an example, PL 230 may be implemented as field programmable gate array (FPGA) circuitry. PL 230 may include an array of programmable circuit blocks. Examples of programmable circuit blocks within PL 230 include, but are not limited to, interconnect block 231, PL interface blocks 232, configurable logic blocks (CLBs), dedicated random access memory blocks (BRAM), digital signal processing blocks (DSPs), clock managers, and/or delay lock loops (DLLs). In the example of FIG. 2, PL 230 is shown in two separate sections. In another example, PL 230 may be implemented as a unified region of programmable circuitry. In still another example, PL 230 may be implemented as more than two different regions of programmable circuitry. The particular organization of PL 230 is not intended as a limitation. In some embodiments, the PL 230 may include some programmable circuit blocks. Each programmable circuit block within PL 230 may include both programmable interconnect circuitry (e.g., the interconnect block 231) and programmable logic circuitry. The programmable interconnect circuitry may include a large number of interconnect wires of varying lengths interconnected by programmable interconnect points (PIPs). The interconnect wires may be configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect (e.g., the interconnect block 231) and programmable logic circuitries may be programmed by loading configuration data into internal configuration memory cells that define how the programmable elements are configured and operate.

In some embodiments, multiple power supplies may be required to power different PL resources in IC 215. The different resources may operate at different voltage levels for increased performance or signal strength while preserving improved immunity to noise and parasitic effects. For example, the interconnect block 231 may operate at a $V_{ccint}$ power domain. Accordingly, the PL interface 232 may be used to interface between domains of different voltages. An example of a PL interface architecture is described in further detail with reference to FIG. 3B.

IC 215 also includes a processor system (PS) 235 implemented as hardwired circuitry that is fabricated as part of IC 215. PS 235 may be implemented as, or include, any of a variety of different processor types. For example, PS 235 may be implemented as an individual processor, e.g., a single core capable of executing program code. In another example, PS 235 may be implemented as a multi-core processor. In still another example, PS 235 may include one or more cores, modules, co-processors, interfaces, and/or other resources. PS 235 may be implemented using any of a variety of different types of architectures. Example architectures that may be used to implement PS 235 may include, but are not limited to, an ARM processor architecture, an x86 processor architecture, RISC architectures, a GPU architecture, a mobile processor architecture, a DSP architecture, or other suitable architecture that is capable of executing computer-readable instructions or program code. In some embodiments, PS 235 may have both low power domains (LPDs) and full power domains (FPDs).

IC 215 also includes subsystems, such as a network-on-chip (NoC) 225, and/or any of hardwired circuit blocks 240, 245,250, 255, and/or 260. Through the NoC 225, one or more DPEs in the DPE array 220 may be capable of communicating with PS and/or hardwired circuit blocks 255 and 260. In some embodiments, the hardwired circuit blocks 255 and 260 may include I/Os (e.g., extended performance I/Os (XPIOs) 256) or memory controllers (MCs), for example. In some embodiments, one or more DPEs in the DPE array 220 may capable of communicating with hardwired circuit blocks 240, 245, 250 via a system-on-chip (SoC) interface block and PL 230. In some embodiments, the SoC interface block may be coupled directly to one or more subsystems of IC 215. For example, SoC interface block may be coupled directly to PS 235 and/or to other hardwired circuit blocks. In particular embodiments, hardwired circuit blocks 240-260 may be considered examples of ASICs.

In this depicted example, PS 235 also includes a platform management controller (PMC) 265. PMC 265 is designed as the master power supply that takes care of power management (e.g., power-up/down, resets, isolations, IRO clocking). In some embodiments, PMC 265 may be a power domain by itself and have to be up and available to start IC 215 and all other functions on IC 215. And the other power domains may be designed as slave power domains of the PMC power domain. For example, the power supply of the PL 230 (e.g., the power domain of the interconnect block 231) designed as a subset of the PMC 265 power supplies. In some embodiments, the PL 230 may operate at a different reference voltage and a different clock speed than the DPE array 220 and/or the PS 235, for example.

The PMC 265 also includes a power-on-reset system (PORS) 270. The PORS 270 is configured to generate multiple isolation signals for power domain crossing. The PORS 270 is also configured to generate power-on-reset (POR) signals and supply status signals for different power supplies after detecting all power supplies. The supply status signals for different power supplies may indicate the stability of different power domains (e.g., the PL power domain, the PMC power domain). An example of a PORS to control the sequencing among power domains in IC during ramp up and/or ramp down is described in further detail with reference to FIG. 3A.

Although, in this depicted example, the PORS 270 is arranged in the PMC 265, in various embodiments, the PORS 270 may be implemented in a different place (e.g., in the programmable logic PL).

In some embodiments, the PORS 270 may be implemented as hard block fixed circuitry. For example, an application specific integrated circuit (ASIC) may provide a PORS 270 for generating the isolation signals and POR signals.

In some embodiments, some or all of the functions of the PORS 270 may be implemented in a processor (e.g., the PS 235) that is configured to execute a set of instructions stored in a data store to control the generation of the isolation signals and/or the POR signals. The processor (e.g., the PS 235) and the data store may be arranged on the same integrated circuit 215 with the PL 230. In some embodiments, the processor (e.g., the PS 235) and the data store may be implemented in a programmable logic block (e.g., the PL 230) of a system-on-chip (SoC) or implemented in a hard block using fixed circuitry of the SoC.

Figure 3A:
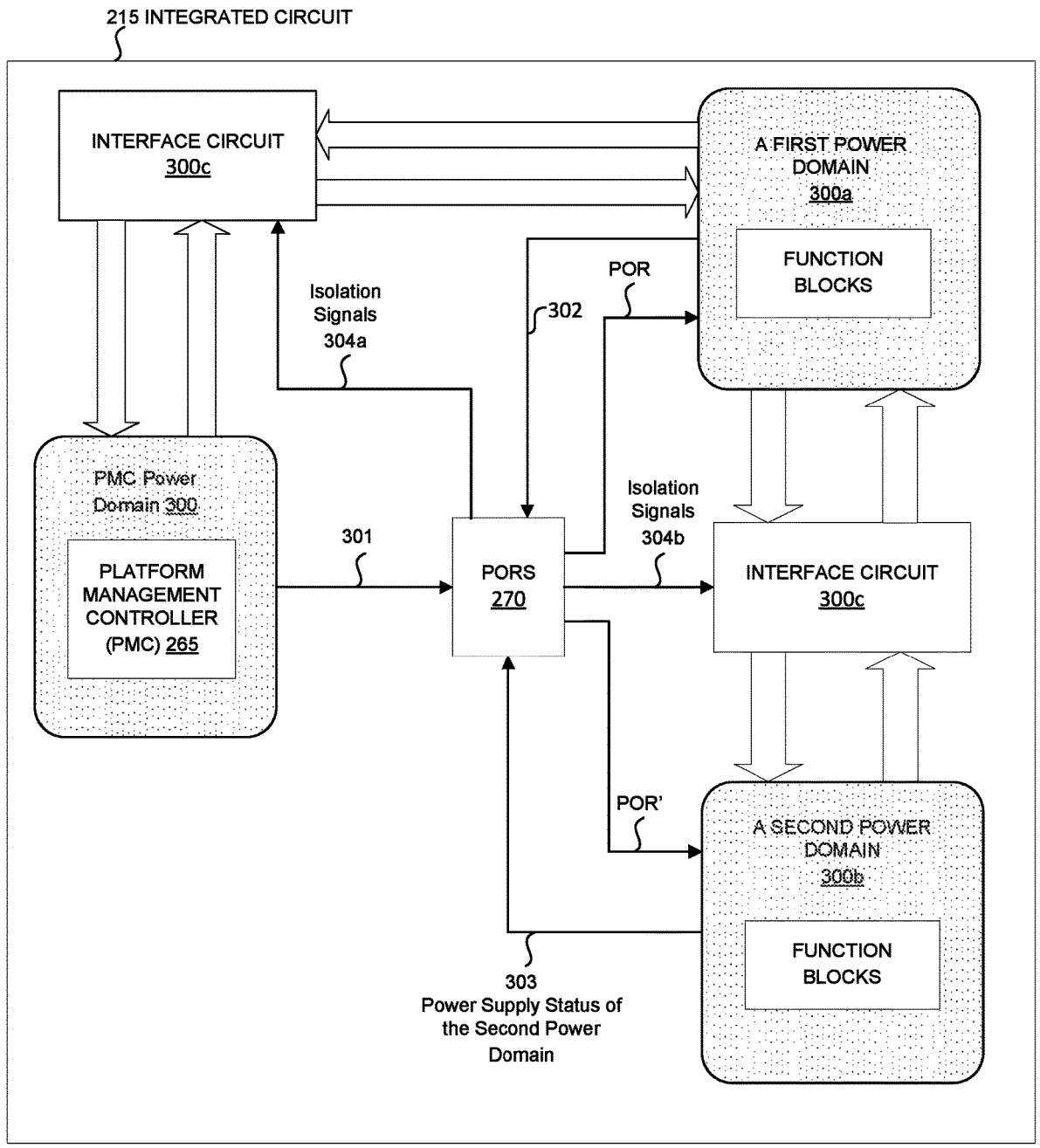
FIG. 3A depicts an exemplary schematic of different power domains on IC.

FIG. 3A depicts an exemplary schematic of different power domains on IC. As different function blocks on IC 215 may operate at different voltages. Thus, IC 215 may include several power domains. For example, PS 235 may include low power domains (LPDs) and/or full power domains (FPDs), NoC 225 may have a different power domain, DPE array 220 may have another different power domain. In this depicted example, the PMC 265 is a power domain by itself and has to be up and available to start IC 215 and all other functions on IC 215.

In this depicted example, IC 215 includes a first power domain 300a (supplied by a first voltage) and second power domain 300b (supplied by a second voltage). The first domain 300a and the second power domain 300b may supply one or more function blocks. For example, in some embodiments, DPE array 220 may be supplied by the first power domain 300a. In some embodiments, the PS 235 may be supplied by the first power domain 300a. In some embodiments, PL 230 may be supplied by the first power domain 300a. In some embodiments, XPIO 256 may be supplied by the first power domain 300a. In some embodiments, NoC 225 may be supplied by the second power domain 300b. In some embodiments, DPE array 220 may be supplied by the second power domain 300b. IC 215 also includes an interface circuit 300c (e.g., the PL interface 232) to interface between the PMC power domain 300 and the first power domain 300a. In this depicted example, the interface circuit 300c (e.g., the PL interface 232) is also be used to interface between the first power domain 300a and the second power domain 300b. In some embodiments, other interface circuits may be used to interface between the first power domain 300a and the second power domain 300b. In some embodiments, IC 215 may include a number of interface blocks to interface among corresponding different power domains. For example, the DPE array 220 in FIG. 2 may include a first interface block to communicate with NoC 225 and a second interface block to communicate with the interconnect block 231. In other examples, IC 215 may include lots of different power domains (e.g., more than five power domains).

To control the sequencing among different power domains, the power status (e.g., voltages) of different power domains may be received by the PORS 270 and processed by the PORS 270 to generate isolation signals to apply on the interface blocks and/or generate power-on-reset signals to reset one or more of the different power domains. For example, the PORS 270 receives the power status (e.g., voltages) 301 of the PMC power domain 300 and a first power status 302 of the first power domain 300a. The received power status may be processed by the PORS 270 to generate isolation signals 304a. The isolation signals 304a may enable or disable the interface circuit 300c to start the data transfer between the two power domains 300, 300a. The interface circuit 300c may include some level shifter circuits that may be enabled by disabled by isolation signals 304a to translate data from the PMC power domain 300 to the first power domain 300a and translate data from the first power domain 300a to the PMC power domain 300. For example, when an isolation signal is at a high level (e.g., digital 1), the interface circuit 300c between the PMC power domain 300 and the first power domain 300a may be enabled. When the isolation signal is at a low level (e.g., digital 0), the interface circuit 300c between the two power domains 300, 300a may be disabled. By controlling the delay between different isolation signals, the powering up and/or the powering down sequences of different power domains may be controlled. Thus, the contention current and/or noise coupling between different power domains may be advantageously reduced. In this depicted example, the PORS 270 also receives the power status (e.g., voltages) 301 of the PMC power domain 300, the first power status 302 of the first power domain 300a, and a second power status 303 of the second power domain 300b. The received power status may be processed by the PORS 270 to generate isolation signals 304b. The isolation signals 304b may enable or disable the interface circuit 300c to start the data transfer between the two power domains 300a, 300b. For example, when an isolation signal is at a high level (e.g., digital 1), the interface circuit 300c between the two power domains 300a, 300b may be enabled. When the isolation signal is at a low level (e.g., digital 0), the interface circuit 300c between the two power domains 300a, 300b may be disabled. By controlling the delay between different isolation signals, the powering up and/or the powering down sequences of different power domains may be controlled. Thus, the contention current and/or noise coupling between different power domains may be advantageously reduced. An example of the PORS architecture is described in further detail with reference to FIG. 4.

Figure 3B:
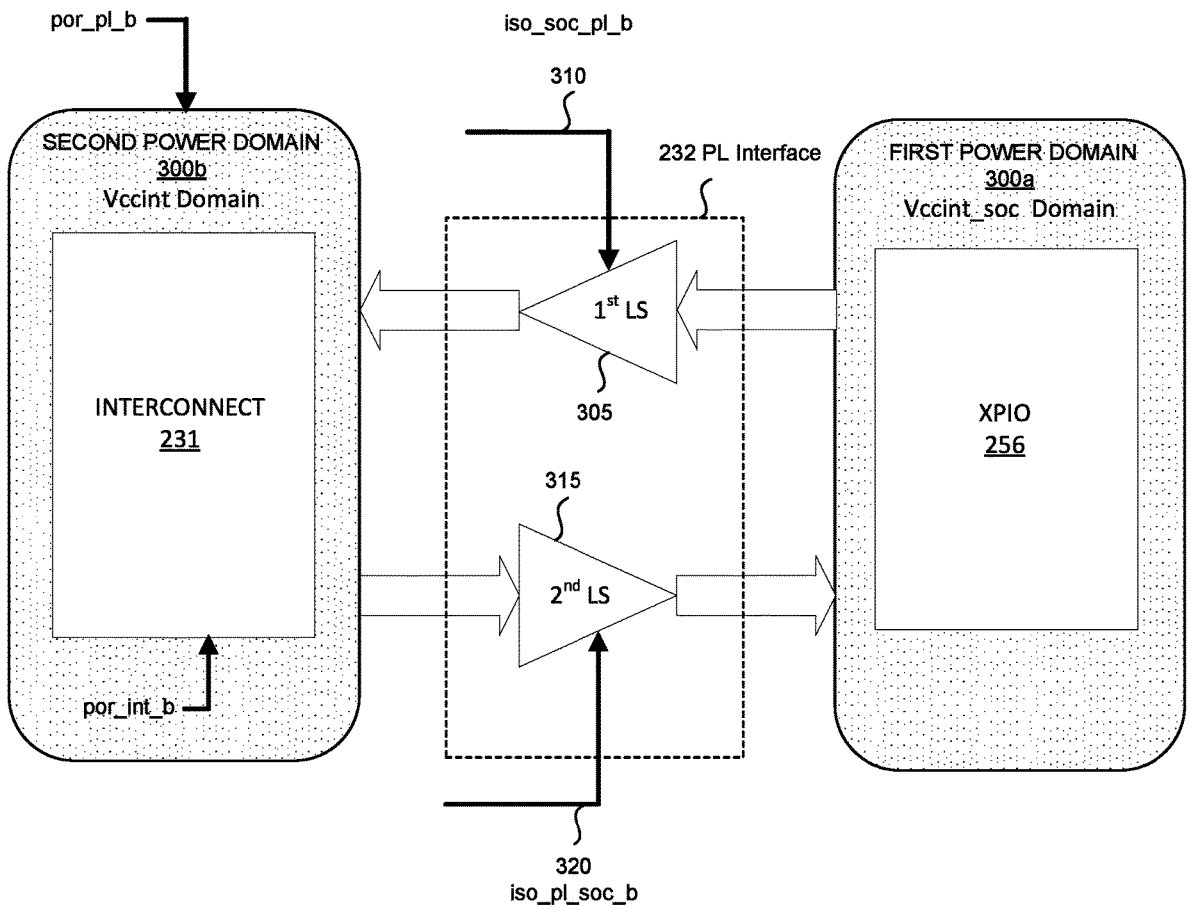
FIG. 3B depicts an exemplary interface architecture between an interconnect block power domain in a programming logic (PL) and an XPIO power domain.

FIG. 3B depicts an exemplary interface architecture between an interconnect block power domain in a programming logic (PL) and an XPIO power domain. More specifically, in this depicted example, the PL interface 232 is capable of interfacing between two different power domains (e.g., the $V_{ccint}$ domain and the $V_{ccint\_soc}$ domain). In this case, the PL interface 232 is capable of providing an interface that transitions between the operating voltage $V_{ccint}$ of interconnect block 231 and the operating voltage $V_{ccint\_soc}$ of other circuitries (e.g., the NoC 225 and/or XPIO 256) in IC 215. Other circuitries may include NoC, math engine (ME), function blocks in low power domains (LPDs) and/or function blocks in full power domains (FPDs), for example. In this depicted example, the PL interface 232 includes a first level shifter 305 configured to translate signals from SoC power domain (e.g., the power domain of NoC and XPIOs) to PL power domain and allowing compatibility between the SoC power domain and the PL power domain. The first level shifter 305 is controlled by an isolation signal iso_soc_pl_b 310. For example, the first level shifter 305 may be enabled or disabled based on whether the isolation signal iso_soc_pl_b 310 is digital 1 or digital 0.

The PL interface 232 includes a second level shifter 315 configured to translate signals from PL power domain to SoC power domain and allowing compatibility between the PL power domain and the SoC power domain. The second level shifter 315 is controlled by an isolation signal iso_pl_soc_b 320. The isolation signals iso_soc_pl_b 310 and iso_pl_soc_b 320 are used as the gating signals in the level shifters 305/315 across PL power domain and SoC power domains on the chip. The isolation signals may be generated by the PORS 270. An example of a PORS is described in further detail with reference to FIG. 4. In some embodiments, connections between the PL interface 232 and the PL 230 may be programmable (e.g., configurable) in width. For example, the connections between PL interface 232 and the PL 230 may be configured to be 32-bits, 64-bits, or 128-bits in width. In this depicted example, the PORS 270 also generates a POR signal por_pl_b to reset the $V_{ccint}$ domain in response to a predetermined threshold (e.g., the $V_{ccint}$ domain has a voltage change (e.g., glitch) that is no less than, for example, 40 ns). The PORS 270 also generates a POR signal por_int_b to reset the interconnect block 231. In some embodiments, the POR signal por_int_b may be generated (e.g., about 3 us) later than the POR signal por_pl_b to keep the data in the interconnect block 231 enough time to be received by other function blocks.

Figure 4:
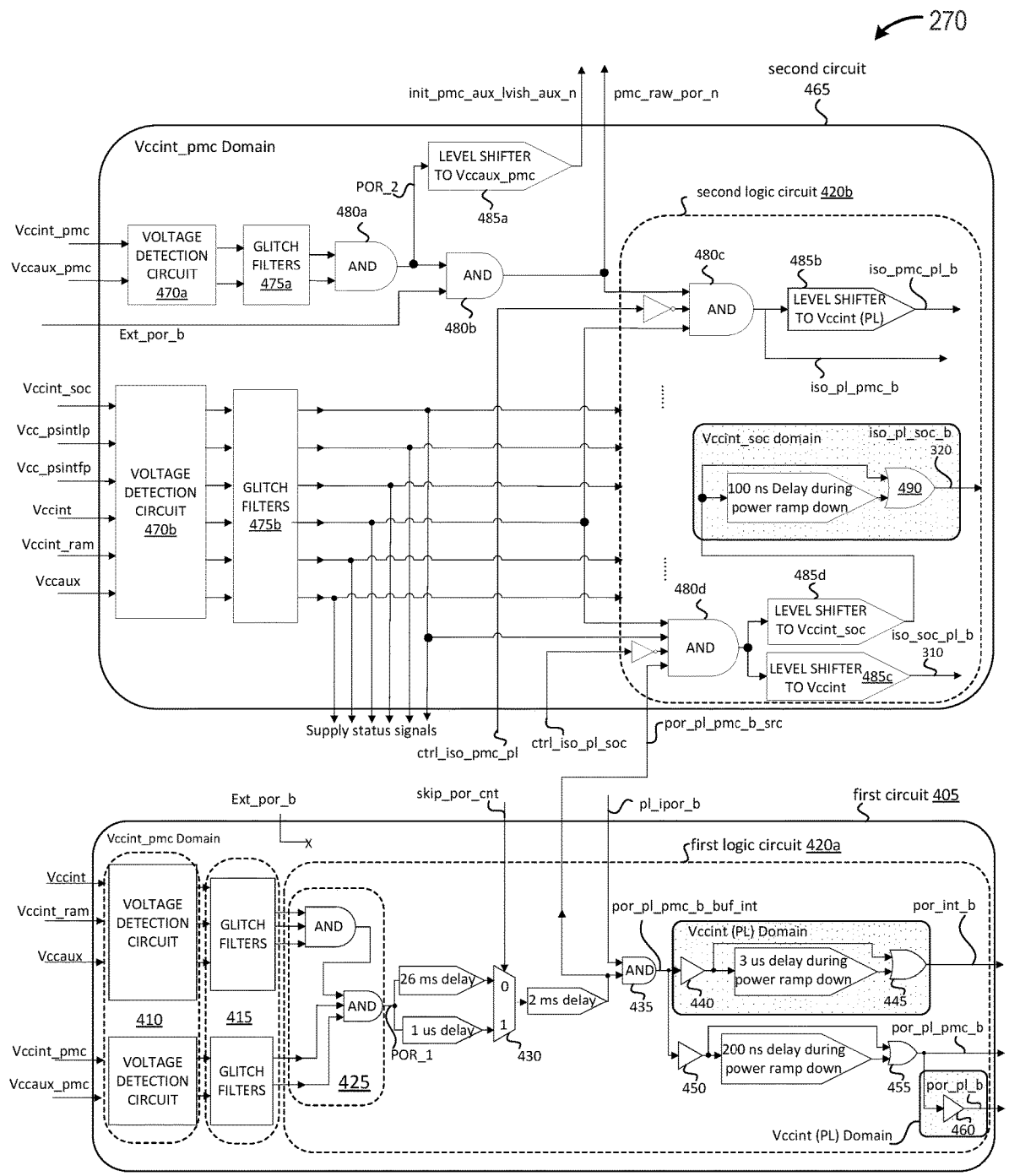
FIG. 4 depicts an exemplary architecture of the power-on-reset system on IC.

FIG. 4 depicts an exemplary architecture of the power-on-reset system on IC. In this depicted example, the PORS 270 includes a first circuit 405 configured to generate power-on-reset signals (e.g., generate a first power-on-reset signal por_int_b for the interconnect block in PL 230, a second power-on-reset signal por_pl_pmc_b for the PL related logic that exists in PMC 265, and a third power-on-reset signal por_pl_b for the PL 230).

The first circuit 405 includes a first voltage detection circuit 410. The first voltage detection circuit 410 includes power-up detectors detecting power supplies of PL 230, PS 235, and PMC 265. In this depicted example, the first voltage detection circuit 410 detects the internal core supply voltage $V_{ccint}$ of PL (e.g., the interconnect block 231), supply voltage $V_{cc\_ram}$ of block BRAM, auxiliary supply voltage $V_{ccaux}$ of PL auxiliary logic, internal core supply voltage $V_{ccint\_pmc}$ of PMC 265, and auxiliary supply voltage $V_{ccaux\_pmc}$ of PMC auxiliary logic. The detected voltages are then filtered by a first glitch filter circuit 415 to filter out any power down supply glitches around, for example, 40 ns or less. The filtered voltages are then processed by a first logic circuit 420a to generate power-on-reset signals por_int_b, por_pl_pmc_b and por_pl_b. The POR signal por_int_b may be used to reset the interconnect block 231, and the POR signal por_pl_b may be used to reset the whole $V_{ccint}$ domain.

In this depicted example, the first logic circuit 420a includes a first AND logic circuit 425. The filtered voltages are all received by the first AND logic circuit 425 to generate a first AND signal POR_1. The first AND signal POR_1 is delayed by 26 ms or 1 us. A selection circuit (e.g., a two-input multiplexer) 430 is used to receive the 26 ms delay signal and the 1 us delay signal. A selection signal skip_por_cnt is used to output the 26 ms delay signal or the 1 us delay signal. A user may use the selection signal skip_por_cnt to select between the two delayed signals. The output signal is then delayed by 2 ms to generate a first intermediate signal por_pl_pmc_b_src. The 2 ms delay may help the $V_{gg}$ to get stabilized, $V_{gg}$ may be the regulated supply of Configuration Memory cells of the Interconnect Block 231. The first intermediate signal por_pl_pmc_b_src and a hardware dependent signal pl_ipor_b are received by a two-input AND gate 435 to generate a por_pl_pmc_b_buf_int signal. The hardware dependent signal pl_ipor_b is a function of an external signal Ext_por_b and an external test (e.g., joint test action group (JTAG) mode). The signal pl_ipor_b signal may be gated by boundary scan, and boundary scan chain may cross many power domains. In some embodiments, isolation controls for the many power domains may be controlled by software, and PL and SoC power domains may be coupled with the por_pl_b signal. The por_ipor_b signal may control the por_pl_b signal for JTAG requirements.

The por_pl_pmc_b_buf_int signal is then processed to generate the power-on-reset signals por_int_b, por_pl_pmc_b and por_pl_b. More specifically, the por_pl_pmc_b_buf_int signal is received by a first buffer 440. The first buffered por_pl_pmc_b_buf_int signal is delayed by 3 us during power ramp down. The first buffered por_pl_pmc_b_buf_int signal and the 3 us delayed por_pl_pmc_b_src signal are received by a first two-input OR gate 445 to generate the first power-on-reset signal por_int_b. The por_pl_pmc_b_buf_int signal is received a second buffer 450. The second buffered por_pl_pmc_b_buf_int signal is delayed by, for example, about 200 ns during power ramp down. The second buffered por_pl_pmc_b_buf_int signal and the 200 ns delayed por_pl_pmc_b_buf_int signal are received by a second two-input OR gate 455 to generate the second power-on-reset signal por_pl_pmc_b. The second power-on-reset signal por_pl_pmc_b is an internal POR signal used in the PMC power domain 300. The second power-on-reset signal por_pl_pmc_b is then buffered by a third buffer 460 to generate the third power-on-reset signal por_pl_b. The third power-on-reset signal por_pl_b is the internal POR that is released after all the internal PMC and PL detectors trip and the Interconnect and the configuration memory cells are ready to be configured. The third power-on-reset signal por_pl_b may also make sure that the internal regulated supply ($V_{gg}$) of the memory cells is up and stable. The first power-on-reset signal por_int_b is a delayed version of the por_pl_b and may be used to avoid contention in interconnect during power-down. The second power-on-reset signal por_pl_pmc_b may have the same function of the third power-on-reset signal por_pl_b.

In this depicted example, the PORS 270 also includes a second circuit 465 configured to generate isolation signals that may be used by the PL interface 232. The second circuit 465 includes a second voltage detection circuit 470a. The second voltage detection circuit 470a detects the internal core supply voltage $V_{ccint\_pmc}$ of PMC and auxiliary supply voltage $V_{ccaux\_pmc}$ of PMC auxiliary logic. The second detected voltages are then filtered by a second glitch filter circuit 475a. The filtered second voltages are then processed by a second two-input AND gate 480a to generate a second AND signal POR_2. The second AND signal POR_2 is received by a $V_{ccaux\_pmc}$ level shifter 485a to generate a second intermediate signal init_pmc_aux_Ivish_aux_n. The second AND signal POR_2 and an external power-on-reset signal Ext_por_b are then received by a third two-input AND gate 480b to generate a third AND signal pmc_raw_por_n. The third AND signal pmc_raw_por_n may function as a master power-on-reset signal for the entire IC 215. The external power-on-reset signal Ext_por_b is released by the user to confirm if the PMC supplies are ramped-up. User confirmation may be needed before releasing the actual internal POR signal. In some embodiments, the first AND signal POR_1 and the second AND signal POR_2 may be monitored by a watchdog circuit. When the first voltage detection circuit 410 and/or the second voltage detection circuit 470a fail, the watchdog circuit may detect the failure and enforce the first AND signal POR_1 and the second AND signal POR_2 externally to bypass the first voltage detection circuit 410 and/or the second voltage detection circuit 470a, which may guarantee the generation of isolation signals, the first AND signal POR_1 and the second AND signal POR_2 may be the failsafe options.

The second circuit 465 also includes a third voltage detection circuit 470b. The third voltage detection circuit 470b detects power status of all power domains in IC 215 except the PMC power domain 300. In this depicted example, the third voltage detection circuit 470b detects internal core supply voltage $V_{ccint\_soc}$ of NoC 225 or XPIO 256, low power domains $V_{cc\_psintlp}$ of PS 235, full power domain $V_{cc\_psintfp}$ of PS 235, internal core supply voltage $V_{ccint}$ of PL 230, internal core supply voltage $V_{ccint\_ram}$ of block BRAM and auxiliary supply voltage $V_{ccaux}$ of PL auxiliary logic. The third voltage detection circuit 470b may also detect the power supply status of the DPE array 220, for example. In this depicted example, the voltages detected by the third voltage detection circuit 470b are filtered by a third glitch filter circuit 475b. All the filtered third detected voltages are outputted as supply status signals. The filtered third detected voltages, the third AND signal pmc_raw_por_n, a first control signal ctrl_iso_pmc_pl, a second control signal ctrl_iso_pl_soc, and the first intermediate signal por_pl_pmc_b_src are processed by a second logic circuit 420b to generate isolation signals between different power domains. The first control signal ctrl_iso_pmc_pl and the second control signal ctrl_iso_pl_soc may be stored in on-chip control registers. For example, the first control signal ctrl_iso_pmc_pl may be a register-based control signal to release or isolate the signals from the PMC power domain ($V_{ccint\_pmc}$) to the PL power domain ($V_{ccint}$). For example, when the control signal ctrl_iso_pmc_pl is at a high level (e.g., digital 1), the signals from the PMC power domain ($V_{ccint\_pmc}$) to the PL power domain ($V_{ccint}$) may be isolated. When the control signal ctrl_iso_pmc_pl is at a low level (e.g., digital 0), the signals from the PMC power domain ($V_{ccint\_pmc}$) to the PL power domain ($V_{ccint}$) may be released. The second control signal ctrl_iso_pl_soc may also be a register-based control signal to release or isolate the signals from the PL power domain ($V_{ccint}$) to the NoC/XPIO power domain ($V_{ccint\_soc}$). Various control signals ctrl_iso_* may be similarly generated for various power domain crossings listed in FIG. 5 that are not shown in the FIG. 4.

In this depicted example, the filtered $V_{ccint}$, the third AND signal pmc_raw_por_n, and an inverted first control signal ctrl_iso_pmc_pl are received by a three-input AND gate 480c to generate a fourth AND signal. The fourth AND signal is an isolation signal iso_pl_pmc_b. The isolation signal iso_pl_pmc_b may be used to enable a level shifter that translates data from the PL 230 to the PMC 265. The isolation signal iso_pl_pmc_b is also received by a first $V_{ccint}$ level shifter 485b to generate an isolation signal iso_pmc_pl_b. The isolation signal iso_pmc_pl_b may be used to enable a level shifter that translates data from the PMC 265 to the PL 230. The filtered $V_{ccint}$, the filtered $V_{ccint\_soc}$, and an inverted second control signal ctrl_iso_pl_soc are received by a four-input AND gate 480*d* to generate a fifth AND signal. The fifth AND signal is received by a second $V_{ccint}$ level shifter 485*c* to generate an isolation signal iso_soc_pl_b. The isolation signal iso_soc_pl_b may be used to enable a level shifter that translates data from the SoC 215 to the PL 230. The fifth AND signal is also processed by a $V_{ccint\_soc}$ level shifter 485*d*, delayed by, for example, about 100 ns during power ramp down, and an OR gate 490 to generate an isolation signal iso_pl_soc_b. The isolation signal iso_pl_soc_b may be used to enable a level shifter that translates data from the PL 230 to the SoC 215. An exemplary data sheet of isolation signals that may be generated by the second logic circuit is described with reference to FIG. 5.

For example, in one mode, all the voltages (e.g., $V_{ccint\_pmc}$, $V_{ccaux\_pmc}$) in the PMC domain and the $V_{ccint}$ of PL may be at a high level. By controlling the ctrl_iso_pmc_pl signal, the isolation signals iso_pmc_pl_b and iso_pl_pmc_b may be generated at a high level (e.g., digital 1). Thus, corresponding level shifters, arranged between the PMC and PL, controlled by the isolation signals, may be enabled. In another mode, when all the voltages (e.g., $V_{ccint\_pmc}$, $V_{ccaux\_pmc}$) in the PMC domain may be at a high level, and the voltage $V_{ccint}$ in the PL domain, the voltage $V_{ccint\_soc}$ in the NoC/XPIO domain are at a high level, by controlling the ctrl_iso_pl_soc signal, the isolation signals iso_soc_pl_b 310 and iso_pl_soc_b 320 may be generated at a high level (e.g., digital 1). Thus, corresponding level shifters controlled by the isolation signals may be enabled.

In some embodiments, the first glitch filter circuit 415, the second glitch filter circuit 475*a*, and/or the third glitch filter circuit 475*b* may be configured to keep the generated isolation signals enabled in response to a disturbance (e.g., power-down glitches) less than about, for example, 40 ns on any of the PMC power domain or the SoC power domain. The disturbance may be a voltage that falls below a predetermined minimum operating voltage threshold for less than a predetermined time threshold. When there is a glitch greater than 40 ns powering down on the PL supplies (e.g., $V_{ccint\_ram}$, $V_{ccint}$, $V_{ccaux}$), the isolation signal iso_pl_soc_b 320 may be generated with a delay compared to the isolation signal iso_soc_pl_b 310. For example, the isolation signal iso_pl_soc_b 320 may be generated about 100 ns later than the isolation signal iso_soc_pl_b 310. Thus, the second level shifter 315 may be enabled about 100 ns later than the first level shifter 305. The PORS 270 then generates the por_pl_b signal with a 200 ns delay, compared to the isolation signal iso_soc_pl_b 310, to reset the $V_{ccint}$ domain. This way of sequencing the isolation signals may avoid noise or glitch propagation to XPIO 256 during power-down. The level shifters (e.g., the second level shifter 315) from the Interconnect (PL Domain) to XPIO (SoC domain) may be clamped (with iso_pl_soc_b=0) 100 ns before switching off the PL domain by asserting por_pl_b low. The interconnect block 232 may be then reset in 3 us by the por_int_b signal later to por_pl_b to avoid any contention in the Interconnect due to $V_{gg}$ memory cells.

FIG. 5 depicts an exemplary data sheet relating to exemplary isolation signals generated by the power-on-reset system. The data sheet includes isolation signals among different power domains. For example, the data sheet includes isolation signal iso_soc_pmc_b and isolation signal iso_pl_pmc_b. The data sheet also includes isolation signals (e.g., iso_1_me_pl, iso_1_pl_me, iso_2_me_pl, etc.) between math engine and PL, and isolation signals (e.g., iso_1_me_soc, iso_1_soc_me, iso_2_me_soc, etc.) between math engine and SoC. Splitting part of the POR to cater the math engine (ME) may substantially reduce or eliminate buffering/loading requirements.

Figure 6:
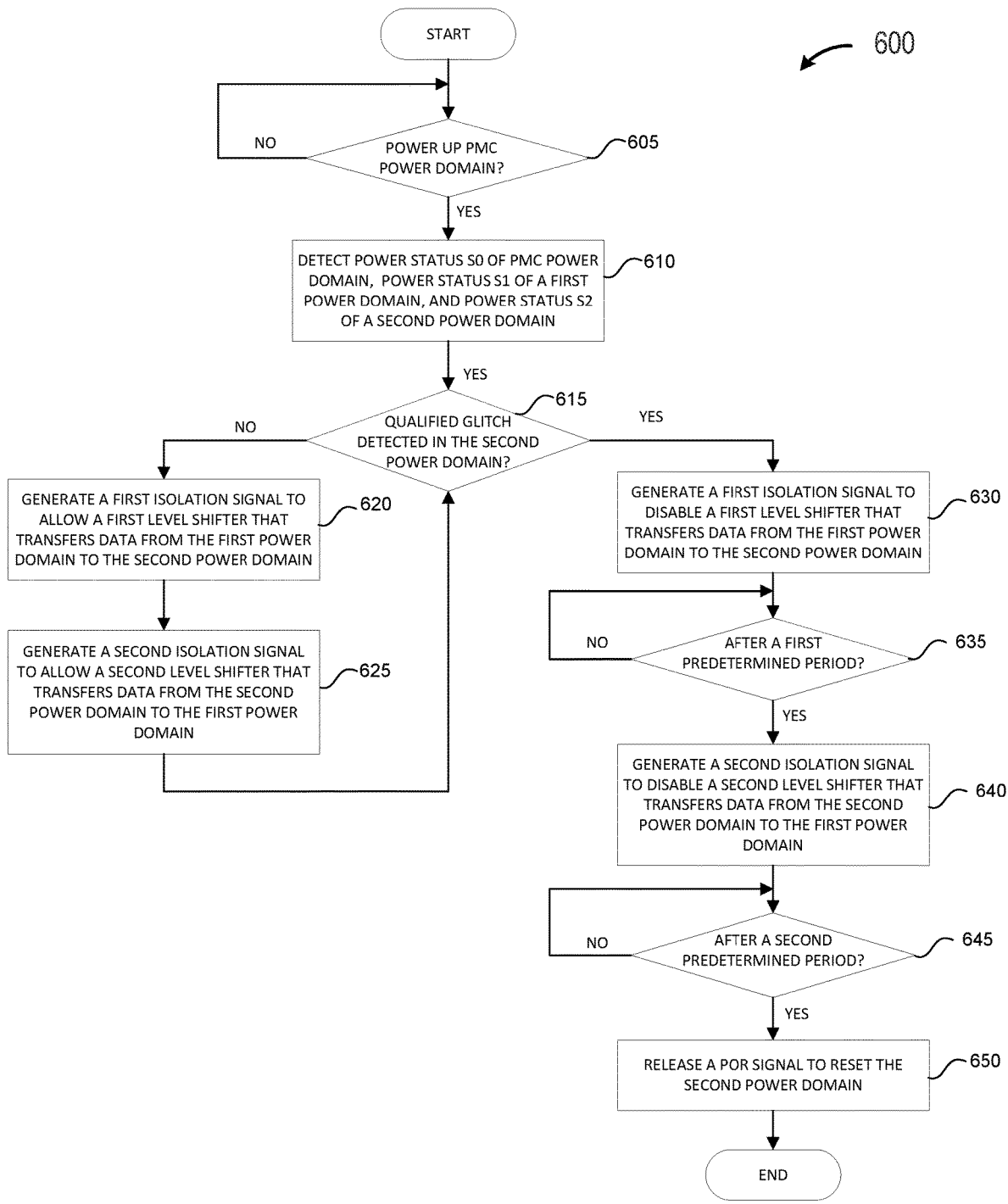
FIG. 6 depicts a flow chart of an exemplary method to coordinate power transitions among power domains in IC.

FIG. 6 depicts a flow chart of an exemplary method to coordinate power transitions among power domains in IC. Power transitions may include powering up and/or powering down the power domains in the IC 215. In method 600, at 605, a controller (e.g., the PS 235) detects whether the PMC power domain 300 (e.g., master power supply) has been powered up or not. If the PMC power domain 300 has not been powered up (e.g., the $V_{ccint\_pmc}$ and the $V_{ccaux\_pmc}$ are in low level), then the controller keeps monitoring the status of the PMC power domain 300. If the PMC power domain 300 has been powered up (e.g., the $V_{ccint\_pmc}$ and the $V_{ccaux\_pmc}$ are in high level), then, in this depicted example, at 610, the controller instructs voltage detection circuits to detect power status S0 (e.g., voltage) of the PMC power domain 300, power status S1 (e.g., voltage) of a first power domain (e.g., 300*a*) (e.g., slave power supply) and power status S2 of a second power domain (e.g., 300*b*) (e.g., slave power supply). For example, the voltage detection circuits detect the power supply $V_{ccint\_soc}$ of the XPIO domain and the power supply $V_{ccint}$ of the interconnect domain. In some embodiments, the first power domain and the second power domain may be any power domains (e.g., PL, PS, NoC, XPIO, or ME) of IC 215 other than the PMC power domain. In some embodiments, the controller may instruct voltage detection circuits to detect power status S0 (e.g., voltage) of the PMC power domain 300 and power status S1 (e.g., voltage) of a first power domain (e.g., 300*a*) and generate isolation signals and/or POR signals for the PMC power domain and/or the first power domain 300*a* as needed.

At 615, the controller determines whether the PMC power domain, the first power domain, and/or the second power domain has a glitch that is no less than a predetermined threshold (e.g., 40 ns). For example, in this illustrative embodiment, the controller determines whether the second power domain has a glitch that greater than or equal 40 ns.

If the glitch is less than 40 ns, then, at 620, the controller instructs the PORS 270 to generate a first isolation signal (e.g., 310) to allow a first level shifter (e.g., level shifter circuit 305) that transfers data from the first power domain (e.g., a first power domain 300*a*) to the second power domain (e.g., a second power domain 300*b*), and at 625, the controller instructs the PORS 270 to generate a second isolation signal (e.g., the second isolation signal 320) to allow a second level shifter (e.g., level shifter circuit 315) that transfers data from the second power domain to the first power domain. And the method loops back to 615 to keep monitoring whether the second power domain has a glitch that greater than or equal 40 ns.

If the glitch is greater than or equal 40 ns (e.g., the glitch is between 40 ns and 80 ns), then, at 630, the controller instructs the PORS 270 to generate a first isolation signal to disable a first level shifter that transfers data from the first power domain to the second power domain, and at 635 and 640, the controller instructs the PORS 270 to generate a second isolation signal to disable a second level shifter that transfers data from the first power domain to the second power domain with a first predetermined delay (e.g., 100 ns) after the generation of the first isolation signal. At 645 and 650, the controller instructs the PORS 270 to generate a POR signal to reset the second power domain with a second predetermined delay (e.g., 200 ns after the generation of the first isolation signal, or 100 ns after the generation of the second isolation signal).

In some embodiments, when the first power domain or the PMC power domain has a large glitch (e.g., has a voltage disturbance greater than 40 ns), the PORS 270 may generate a POR signal to reset the first power domain or the PMC power domain.

Different sub-systems (e.g., PL (interconnect), NoC (SoC), XPIO, ME, and/or PS) may be controlled with respect to different isolation signals. By generating isolation signals and POR signals with different predetermined delays (e.g., about 100 ns delay, 3 us delay, 200 ns delay), smooth power sequencing may be controlled to avoid the contention during power-up and/or power-down of various power supplies. For example, when one of the PL supplies is ramp-down, the sequencing of isolation signals between the PL and SoC may be controlled to avoid the glitch propagation to XPIO, if one of the PL supplies ramp down. The sequence of events to avoid glitches may include first, isolating XPIO/SoC to PL by using the iso_soc_pl_b, then, isolating PL to SoC with by using the iso_pl_soc_b signal which is delayed by about 100 ns during power-down, and, releasing the por_pl_b signal which is delayed by about 200 ns compared to the isolation from XPIO/SoC to PL during power-down. Thus, the level shifters from the interconnect block in PL domain to XPIO's SoC domain may be clamped before switching off the PL domain by asserting the por_pl_b low.

Although various embodiments have been described with reference to the figures, other embodiments are possible. For example, mini PORS may be used when new power domains are added. In some embodiments, the PL interface 232 (e.g., the level shifters 305, 320) may be arranged on PS 235 or PL 230.

In some embodiments, some or all the voltage detection circuits 410, 470a, 470b may be arranged on PS 235 or the PL 230. In another embodiment, some or all the logic gates (e.g., AND gates, OR gates) in the first circuit 405 and in the second circuit 465 may be arranged on PS 235 or the PL 230.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs). In some embodiments, the module(s) may involve execution of preprogrammed instructions and/or software executed by a processor. For example, various modules may involve either hardware or software.

In various implementations, the communication system may communicate using suitable communication methods, equipment, and techniques. For example, the system may communicate with compatible devices (e.g., devices capable of transferring data to and/or from the system) using point-to-point communication in which a message is transported directly from a source to a receiver over a dedicated physical link (e.g., fiber optic link, infrared link, ultrasonic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An integrated circuit (IC) comprising:
    a first region supplied by a first power domain;
    a second region supplied by a second power domain;
    a first level shifting circuit coupled to translate a first data from the first power domain to the second power domain;
    a second level shifting circuit coupled to translate a second data from the second power domain to the first power domain;
    a power-on-reset system (PORS) comprising:
        a voltage detection circuit configured to detect voltages of the first power domain and the second power domain; and,
        a control circuit coupled to the first level shifting circuit and the second level shifting circuit and configured to generate a first isolation signal to control the first level shifting circuit and a second isolation signal to control the second level shifting circuit in response to the detected voltages of the first power domain and the second power domain.

2. The integrated circuit of claim 1, wherein the PORS further comprises a glitch filter circuit coupled to the voltage detection circuit to indicate a voltage change of the second power domain.

3. The integrated circuit of claim 2, wherein, when the voltage change of the second power domain exceeds a predetermined time period, the control circuit is further configured to disable the second level shifting circuit a first predetermined delay after disabling the first level shifting circuit.

4. The integrated circuit of claim 3, wherein, the control circuit is further configured to release a power-on-reset signal to reset the second power domain a second predetermined delay after disabling the second level shifting circuit.

5. The integrated circuit of claim 1, wherein the second region is disposed in a portion of the IC that is non-overlapping with the first region.

6. The integrated circuit of claim 1, wherein the first region comprises a platform management controller (PMC) configured to work as a master power supply and provide power management of the IC.

7. The integrated circuit of claim 6, wherein the second region comprises a processor system (PS).

8. The integrated circuit of claim 6, wherein the second region comprises a block of programmable logic (PL).

9. The integrated circuit of claim 8, further comprising:
a third region supplied by a third power domain;
a third level shifting circuit coupled to translate a third data from the second power domain to the third power domain; and,
a fourth level shifting circuit coupled to translate a fourth data from the third power domain to the second power domain,
wherein, the voltage detection circuit is further configured to detect voltages of the first power domain, the second power domain, and the third power domain, the control circuit is further coupled to the third level shifting circuit and the fourth level shifting circuit and configured to generate a third isolation signal to control the third level shifting circuit and a fourth isolation signal to control the fourth level shifting circuit in response to the detected voltages of the first power domain, the second power domain and the third power domain.

10. The integrated circuit of claim 9, wherein the third region comprises a data processing engine (DPE) array.

11. A method comprising:
supplying a first region by a first power domain;
supplying a second region by a second power domain, wherein a first level shifting circuit is coupled to transfer a first data from the first power domain to the second power domain, and a second level shifting circuit is coupled to transfer a second data from the second power domain to the first power domain;
detecting voltages of the first power domain and the second power domain; and,
generating a first isolation signal to control the first level shifting circuit and a second isolation signal to control the second level shifting circuit in response to the detected voltages of the first power domain and the second power domain.

12. The method of claim 11, further comprising, wherein, when a voltage change of the second power domain exceeds a predetermined time period,
using the first isolation signal to disable the first level shifting circuit;
using the second isolation signal to disable the second level shifting circuit a first predetermined delay after disabling the first level shifting circuit; and,
releasing a power-on-reset signal to reset the second power domain a second predetermined delay after disabling the second level shifting circuit.

13. The method of claim 11, wherein the second region is disposed in a portion of the IC that is non-overlapping with the first region.

14. The method of claim 11, wherein the first region comprises a platform management controller (PMC) configured to work as a master power supply and provide power management of the IC.

15. The method of claim 14, wherein the second region comprises a processor system (PS).

16. The method of claim 14, wherein the second region comprises an extended performance I/O block (XPIO).

17. The method of claim 14, wherein the second region comprises a block of programmable logic (PL).

18. The method of claim 17, further comprising:
supplying a third region by a third power domain, wherein a third level shifting circuit is coupled to transfer a third data from the second power domain to the third power domain, and a fourth level shifting circuit is coupled to transfer a fourth data from the third power domain to the second power domain;
detecting voltages of the first power domain, the second power domain, and the third power domain; and,
generating a third isolation signal to control the third level shifting circuit and a fourth isolation signal to control the fourth level shifting circuit in response to the detected voltages of the first power domain, the second power domain, and the third power domain.

19. The method of claim 18, further comprising, wherein, when a voltage change of the third power domain exceeds a predetermined time period,
using the third isolation signal to disable the third level shifting circuit;
using the fourth isolation signal to disable the fourth level shifting circuit a third predetermined delay after disabling the third level shifting circuit; and,
releasing a power-on-reset signal to reset the third power domain a fourth predetermined delay after disabling the fourth level shifting circuit.

20. The method of claim 18, wherein the third region comprises a data processing engine (DPE) array.

* * * * *